United States Patent [19]
Wendt et al.

[11] Patent Number: 6,165,835
[45] Date of Patent: Dec. 26, 2000

[54] METHOD FOR PRODUCING A SILICON CAPACITOR

[75] Inventors: Hermann Wendt, Grasbrunn; Hans Reisinger, Grünwald; Andreas Spitzer, München; Reinhard Stengl, Stadtbergen, all of Germany; Ulrike Grüning, Wappingers Falls, N.Y.; Josef Willer, Riemerling, Germany; Wolfgang Honlein, Unterhaching, Germany; Volker Lehmann, München, Germany

[73] Assignee: Siemens Aktiengesellschaft, Munich, Germany

[21] Appl. No.: 09/341,937

[22] PCT Filed: Jan. 12, 1998

[86] PCT No.: PCT/DE98/00089

§ 371 Date: Jul. 20, 1999

§ 102(e) Date: Jul. 20, 1999

[87] PCT Pub. No.: WO98/32166

PCT Pub. Date: Jul. 23, 1998

[30] Foreign Application Priority Data

Jan. 21, 1997 [DE] Germany .......................... 197 01 935

[51] Int. Cl.$^7$ .............................................. H01L 21/8242
[52] U.S. Cl. ......................... 438/242; 438/246; 438/960
[58] Field of Search ................................. 438/242, 246, 438/287, 389, 408, 409, 960

[56] References Cited

U.S. PATENT DOCUMENTS

| 5,378,907 | 1/1995 | Melzner | 438/242 |
|---|---|---|---|
| 5,431,766 | 7/1995 | Propst et al. | 156/345 |
| 5,753,526 | 5/1998 | Ozaki | 438/246 |

FOREIGN PATENT DOCUMENTS

| 0 528 281 A3 | 6/1992 | European Pat. Off. . |
|---|---|---|
| 0 709 911 A2 | 3/1995 | European Pat. Off. . |
| 44 28 195 C1 | 9/1994 | Germany . |
| 2 262 186 | 4/1991 | United Kingdom . |

OTHER PUBLICATIONS

Article entitled "A novel capacitor technology based on porous silicon", Lehmann et al., *Thin Solid Films*, 276 (1996) 138–142.

*Primary Examiner*—Chandra Chaudhari
*Attorney, Agent, or Firm*—Schiff Hardin & Waite

[57] ABSTRACT

In producing a silicon capacitor, hole structures (2) are created in a silicon substrate (1), at the surface of which structures a conductive zone (3) is created by doping and whose surface is provided with a dielectric layer (4) and a conductive layer (5), without filling the hole structures (2). To compensate mechanical strains upon the silicon substrate (1) which are effected by the doping of the conductive zone (3), a conformal auxiliary layer (6) is formed on the surface of the conductive layer (5), which auxiliary layer is under a compressive mechanical stress.

22 Claims, 1 Drawing Sheet

METHOD FOR PRODUCING A SILICON CAPACITOR

FIELD OF THE INVENTION

The present invention relates generally to methods for manufacturing silicon capacitors. More specifically, the present invention relates to a method for manufacturing silicon capacitors whereby an auxiliary layer is formed on top of the lower layers and under a compressive mechanical stress to offset the bending or warping caused by the formation of the underlying conductive zone.

BACKGROUND OF THE INVENTION

European Patent Application No. 05 028 281 A2 teaches a silicon capacitor which comprises an n-doped silicon substrate whose surface is structured in a characteristic fashion by an electrochemical etching in an acidic electrolyte containing fluoride in which the substrate is connected as an anode. In the electrochemical etching, more or less regularly arranged hole structures form at the surface of the substrate. The hole structures have an aspect ratio of up to around 1:1000. The surface of the hole structures is provided with a dielectric layer and a conductive layer. The conductive layer, dielectric layer and silicon substrate form a capacitor in which specific capacities of up to $100\,\mu V/mm^3$ are achieved due to the surface expansion that is effected by the hole structures. To increase the conductivity of the substrate, it is suggested to provide an $n^+$-doped region at the surface of the hole structures.

Silicon capacitors are typically produced in silicon disks. A bending of the silicon disk is established, which is brought into connection with mechanical strains by the $n^+$-doped zone at the surface of the hole structures, which are up to 300 $\mu m$ thick. This bending of the silicon disk leads to problems in further procedural steps such as lithography, disk thinning and isolation which are necessary for the installation of the silicon capacitor in a housing.

German Patent No. 44 28 195 C1 teaches a method for producing a silicon capacitor of this type. In order to compensate mechanical strains on the silicon substrate which are effected by the doping of the doped zone, the doped region is additionally doped with geranium. The additional doping with geranium leads to an increase in the complexity of processing Therefore, there is need for a method for the production of a silicon capacitor which is simpler than the known method.

The above need is met by the inventive method wherein a plurality of hole structures are generated in a main surface of a silicon substrate. The hole structures comprise a round or polygonal cross-section and sidewalls that are essentially perpendicular to the main surface.

Along the surface of the hole structures, a conductive region is created which is provided with electrically active dopant. The conductive region forms a capacitor electrode in the finished silicon capacitor. It is preferably doped with phosphorous or boron.

A dielectric layer and a conductive layer are deposited on the surface of the conductive zone so as not to fill the hole structures. On the surface of the conductive layer, an auxiliary layer with essentially conformal edge coverage is formed, which layer is subjected to a compressive mechanical stress. Lastly, the hole structures are filled.

Due to the conductive zone which is provided with dopant and which extends along the surface of the hole structures, there results a concave bending of the silicon substrate if the dopant has a smaller covalent bond radius than silicon. This is true of phosphorous and boron. The use of the auxiliary layer, which is under a compressive mechanical stress and which is inserted in the hole structures with conformal edge coverage, effects a bending of the silicon substrate in the direction of a convex shape. This compensates the concave bending of the substrate that is effected by the conductive zone. Problems in the production of the silicon capacitor are thereby avoided. The concave bending of the silicon substrate has the disadvantage that, in conventional production devices, the substrates are held on carriers by low air pressure (what is known as vacuum chucks). A concave bending of the substrate leads to an inability to suck in the substrate, so that an automated production is not possible. On the other hand, slightly convexly shaped substrates can be sucked in on these carriers, since the substrate margin is inclined for sealing against atmospheric pressure.

A layer of thermal $SiO_2$ is particularly suitable as an auxiliary layer that is under compressive mechanical stress. The incorporation of oxygen in the formation of $SiO_2$ by the thermal oxidation of silicon leads to a compressive mechanical stress on the silicon base in the layer of thermal $SiO_2$. Alternatively, a layer of undoped polysilicon can be used. In the growing of a polysilicon layer, in the bottom part of the layer there results a growth of many small crystallites which compete for further growth in the course of the layer deposition. The polysilicon layer is thus under a compressive mechanical stress.

If, subsequent to the formation of the hole structures, the conductive zone, the dielectric layer and the conductive layer, the silicon substrate comprises such a bend that there is a height difference of up to 500 $\mu m$ between the middle of the silicon substrate and the edge, then this concave bend can be compensated by an auxiliary layer of thermal oxide in a thickness of 30 to 250 nm. The thermal oxide auxiliary layer is under a compressive stress of approximately $10^4 N/cm^2$. Given the utilization of an auxiliary layer of polysilicon, a layer thickness between 50 nm and 100 nm is required.

It is conceivable to compensate mechanical stresses in a silicon substrate which are conditioned by layers that contract more strongly than silicon by depositing a correspondingly thick silicon nitride layer on the back side of the silicon substrate. However, it has been demonstrated in the production of a silicon capacitor that such silicon nitride layers with manageable thicknesses of approximately 1 $\mu m$ cannot compensate the concave bend of the silicon substrate. Estimations have shown that the thickness of the silicon nitride layer on the back of the silicon substrate would have to be between 20 and 50 $\mu m$ thick. Such layer thicknesses are not feasible in terms of processing technology, however.

The hole structures are preferably formed by electrochemical etching in an acidic electrolyte containing fluoride, whereby the main surface is in contact with the electrolyte and a voltage is applied between the electrolyte and the silicon substrate such that the silicon substrate is connected as an anode. A back side of the silicon substrate, which is opposite the main surface, is illuminated during the electrochemical etching. Hole structures can thus be formed with diameters in the range from 0.5 $\mu m$ to 10 $\mu m$ and with depths in the range from 50 $\mu m$ to 500 $\mu m$, said hole structures comprising an aspect ratio in the range from 30 to 300. The quotient of depth and diameter is defined as the aspect ratio. The higher the aspect ratio, the more aggravating the concave bend of the silicon substrate becomes, which is due to the conductive region which extends along the surface of the hole structures.

Alternatively, the hole structures can be formed by masked or unmasked anisotropic etching.

The dielectric layer is preferably formed as a multiple layer with a layer sequence of $SiO_2$, $Si_3N_4$ and $SiO_2$. Such layers, which are often referred to as ONO layers, can be formed with very low defect densities. This is an essential precondition for the production of the silicon capacitor, which comprises a large surface due to the surface expansion by the hole structures.

For the production of contacts to the conductive layer and/or to the conductive zone, which contacts act as capacitor electrodes in the finished silicon capacitor, the surface of the conductive layer is preferably exposed in the region of the main surface. The auxiliary layer remains on the surface of the hole structures. Beyond this, for the contacting of the conductive zone, the surface of the conductive zone is exposed in the region of the main surface. Here, as well, the auxiliary layer remains in the region of the hole structures.

Other objects and advantages of the present invention will become apparent from reading the following detailed description and appended claims, and upon reference to the accompanying drawings.

The invention is detailed below with the aid of an exemplifying embodiment, which is illustrated in the figures, wherein.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.;

DETAILED DESCRIPTION OF THE PRESENTLY PREFERRED EMBODIMENTS

Figure 1:
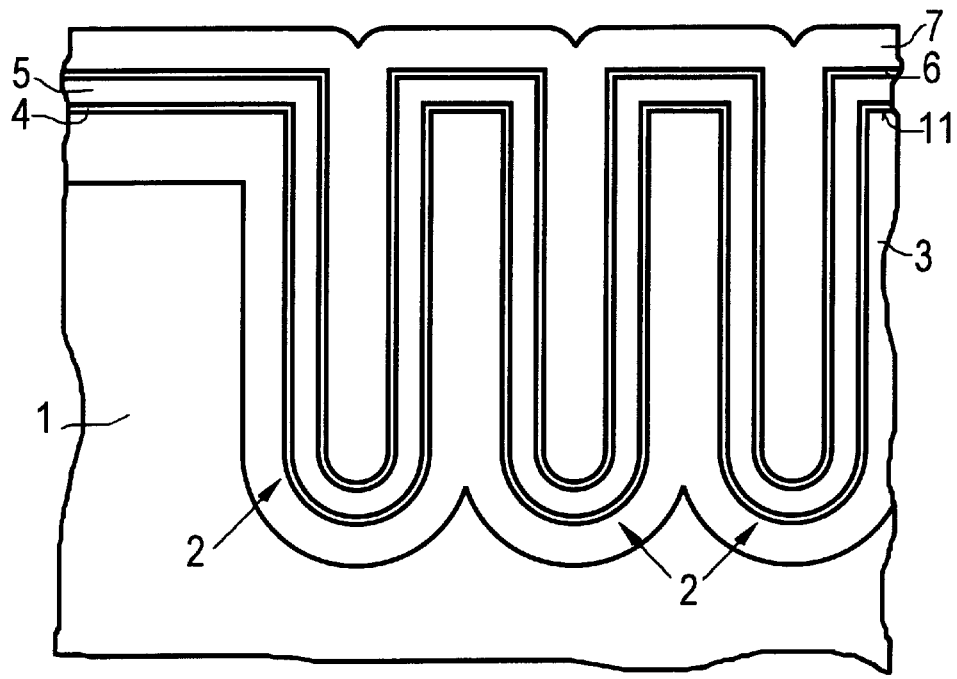
FIG. 1 is a sectional view of a silicon substrate subsequent to the formation of hole structures, a conductive zone along the surface of the hole structures, a dielectric layer, a conductive layer and an auxiliary layer and subsequent to the filling of the hole structures.

A silicon substrate 1 of n-doped monocrystalline silicon comprising a specific resistance of 5 ohms x cm is provided with a number of hole structures 2 by electrochemical etching at a main surface 11 (FIG. 1).

To this end, the main surface 11 is brought into contact with an electrolyte. As the electrolyte, a 6% (by weight) hydrofluoric acid (HF) is used, for example. The silicon substrate 1 is charged as an anode with a potential of 3 volts. The silicon substrate 1 is illuminated from a back side situated opposite the main surface 11. A current density of 10 mA/cm$^2$ is set. In the electromagnetic etching, minority charge carriers move in the n-doped silicon to the main surface 11 which stands in contact with the electrolyte.

At the main surface 11, a space charge zone forms. Since the field strength is greater in the region of depressions in the main surface 11 than outside of this region, the minority charge carriers preferably move to these points. This results in a structuring of the main surface 11. The deeper an initially small unevenness becomes by reason of the etching, the more minority charge carriers move there and the stronger the etching attack is at these points.

The hole structures 2 start to grow out from unevennesses in the main surface 11 that are present in every surface with random orientation. In order to achieve a uniform distribution of the hole structures 2, it is advantageous to purposefully provide the main surfaces 11 with unevennesses prior to the electrochemical etching, said unevennesses acting as germ for the etching attack in the subsequent electrochemical etching. These unevennesses can be produced with the aid of conventional photolithography, for example.

After approximately 180 minutes of etching time, the hole structures comprise an essentially circular diameter of 2 $\mu$m given a depth of 175 $\mu$m.

The silicon substrate 1 is subsequently rinsed with water.

Along the surface of the hole structures, a conductive zone 3 is created which is provided with electrically active dopant. As the electrically active dopant, phosphorous with a dopant concentration between $10^{20}$ cm$^{-3}$ and $10^{21}$ cm$^{-3}$ or boron with a dopant concentration between $10^{20}$ cm$^{-3}$ and $10^{21}$ cm$^{-3}$ is used. The conductive zone 3 thus has an electrical conductivity of approximately $10^{-3}$ $\Omega$ cm. It is thus a suitable capacitor electrode.

For the production of the conductive zone 3, a gas phase diffusion is performed using phosphine or borane at a temperature of 1400° Kelvin. Alternatively, the in-diffusion of the electrically active dopant can also occur by means of a depositing of a correspondingly doped silicate glass layer and out-diffusion from the silicate glass layer. This silicate glass layer must be removed again subsequent to the out-diffusion.

On the surface of the conductive zone 3, a dielectric layer 4 and a conductive layer 5 are subsequently deposited. The dielectric layer 4 is preferably formed by the combined creation of $SiO_2$ and $Si_3N_4$ as a multiple layer with a layer sequence of $SiO_2/Si_3N_4/SiO_2$, since this material comprises a defect thickness that is sufficiently low for a capacitor with a large area. The dielectric layer 4 is created as a multiple layer with a layer sequence $SiO_2/Si_3N_4/SiO_2$ with layer thicknesses of 5 nm $SiO_2$, 20 nm $Si_3N_4$ and 5 nm $SiO_2$, for example.

The conductive layer 5 is formed from n$^+$-doped polysilicon, for example. It is formed in a layer thickness of 400 nm, for example. It thereby takes up some 20 to 50 percent of the usable diameter of the hole structure 2. To form the conductive layer 5, polysilicon which was doped in situ is deposited, or undoped silicon which is subsequently doped by diffusion is deposited.

An auxiliary layer 6 is subsequently formed which is under a compressive mechanical stress. The auxiliary layer 6 is preferably formed by thermal oxidation at 900° C. for 2000 seconds, for example. The auxiliary layer 6 is formed in a thickness of 30 to 250 nm, preferably of 50 nm. The auxiliary layer 6 is under a compressive stress of some $10^4$ N/cm$^2$ and thereby compensates the concave bend of the silicon substrate 1 that is caused by the doping in the conductive zone 3 and potentially by the dielectric layer 4 and the conductive layer 5.

To measure the thickness of the auxiliary layer 6, an n-doped reference substrate is commonly used, on whose level surface an oxide layer simultaneously forms. Since the oxidation rate at the surface of the n$^+$-doped conductive layer 5 is sharply increased, the thickness of the auxiliary layer 6 at the surface of the conductive layer 5 is thicker by a factor of 2 to 4 than the thickness of the oxide layer on the level surface of the reference substrate. The thickness of the auxiliary layer 6 on the reference substrate typically equals 10 to 60 nm.

Alternatively, the auxiliary layer 6 is formed from undoped polysilicon. In this case, it has a thickness of 100 nm.

The remaining interspace in the hole structures 2 is subsequently filled by depositing a polysilicon layer 7. The polysilicon layer 7 is formed in a thickness of 800 nm, for example.

In the silicon capacitor, the conductive layer 5 and the conductive zone 3 act as capacitor electrodes. To form terminals to the capacitor electrodes, it is necessary to at least partially expose the surface of the conductive layer 5 and of the conductive zone 3.

Figure 2:
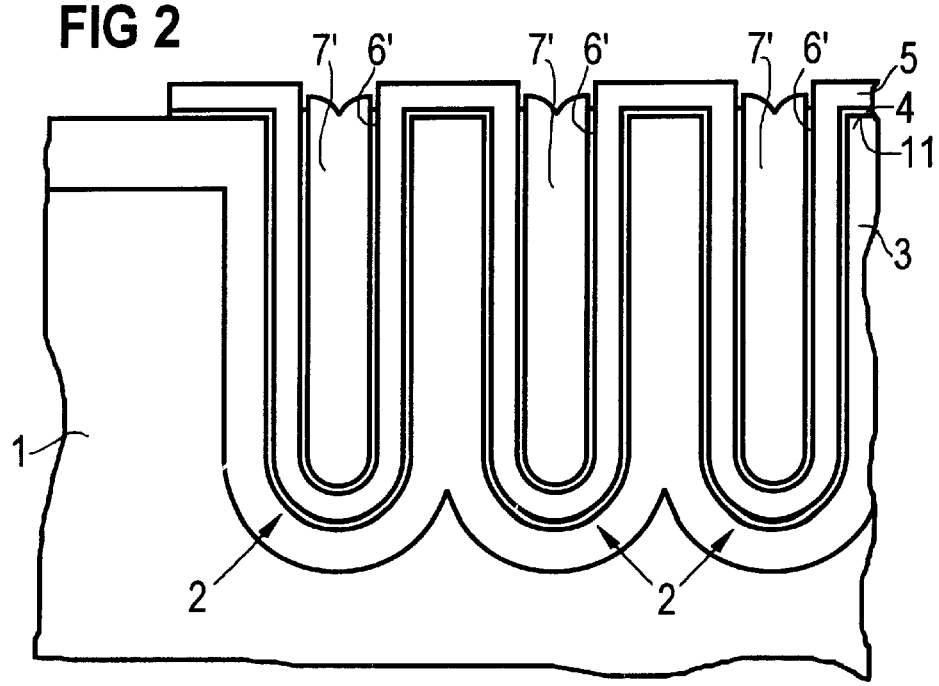
FIG. 2 is a sectional view of the silicon shown in FIG. 1 substrate subsequent to the exposing of the conductive layer in the region of the main surface and the exposing of the surface of the conductive zone for forming the contact.

To this end, the surface of the conductive layer 5 is exposed outside the hole structures 2. This occurs by wet chemical etching of the parts of the polysilicon layer 7 that are arranged above the main surface 11 with an acid etching with a $HNO_3/H_2O/HF$ mixture or basically with KOH. The etching is performed selectively to the auxiliary layer 6. The exposed part of the auxiliary layer 6 is subsequently etched above the main surface 11 with diluted hydrofluoric acid (FIG. 2). This produces a structured auxiliary layer 6' and a structured polysilicon layer 7'.

In the hole structures 2 there remain both the structured auxiliary layer 6' and the structured polysilicon layer 7'. A removal of the structured auxiliary layer 6' from the hole structures 2 would lead to an elastic bending back of the silicon substrate 1. Furthermore, the mechanical stresses on the subsequent layers would demonstrate a strong effect in the course of the production process. This results from the fact that the auxiliary layer 6 leads to a compensation of the concave bend of the silicon substrate 1 but that, due to the auxiliary layer 6, crystal defect densities do not rise so sharply that a hardening of the material sets in.

To partially expose the surface of the conductive zone 3, the conductive layer 5 and the dielectric layer 4 are structured by anisotropic etching using a mask (FIG. 2). Terminals to the conductive zone 3 and the conductive layer 5 are subsequently realized by metal contacts in known fashion, for example (not illustrated).

From the above description, it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed is:

1. A method for producing at least one silicon capacitor comprising the following steps:
   forming a plurality of hole structures in a main surface of a silicon substrate, the hole structures each comprising an upper surface and defining a volume;
   forming a conductive zone in the upper surfaces of the hole structures and the main surface by doping the upper surfaces with an electrically active dopant;
   forming a dielectric layer on the conductive zone;
   forming a conductive layer on the dielectric layer, the dielectric and conductive layers filling only a portion of the volume each hole structure;
   forming an auxiliary layer on the conductive layer under a compressive mechanical stress, the auxiliary layer being coextensive with the conductive layer, the combination of the dielectric, conductive and auxiliary layers filling the volumes of the hole structures.

2. The method of claim 1 wherein the silicon substrate is n-doped, and the step of forming the hole structures comprises electrochemically etching the substrate.

3. The method of claim 2 wherein the electrochemical etching is performed with an acidic electrolyte comprising fluoride in contact with the main surface and wherein a voltage is applied between said electrolyte and the silicon substrate so that the silicon substrate is connected as an anode, and wherein a back side of the silicon substrate that is opposite the main surface is illuminated during the electrochemical etching.

4. The method of claim 1 wherein the step of forming the hole structures comprises forming the hole structures with diameters ranging from about 0.5 µm to about 10 µm and with depths ranging from about 50 µm to about 500 µm and wherein the hole structures comprise an aspect ratio ranging from about 30 to about 300.

5. The method of claim 1 wherein the step of forming the dielectric layer comprises forming multiple dielectric layers with a layer sequence of $SiO_2$, $Si_3N_4$ and $SiO_2$.

6. The method of claim 1 wherein the dopant is selected from the group consisting of phosphorous and boron and the dopant has a concentration ranging from $10^{20}$ cm$^{-3}$ and $10^{21}$ cm$^{-3}$ and wherein the dielectric layer has a thickness ranging from about 10 nm to about 100 nm and wherein the conductive layer comprises doped polysilicon and wherein the auxiliary layer has a thickness ranging from about 30 nm to about 250 nm and the step of forming the auxiliary layer comprises thermally oxidizing $SiO_2$.

7. The method of claim 1 wherein the dopant is selected from the group consisting of phosphorous and boron and the dopant has a concentration ranging from $10^{20}$ cm$^{-3}$ and $10^{21}$ cm$^{-3}$ and wherein the dielectric layer has a thickness ranging from about 10 nm to about 100 nm and wherein the conductive layer comprises doped polysilicon and wherein the auxiliary layer has a thickness ranging from about 50 nm to about 200 nm.

8. The method of claim 1 further comprising the step of removing a portion of the auxiliary layer in registry with the main surface and not in registry with the hole structures.

9. A method for producing at least one silicon capacitor comprising the following steps:
   electrochemically etching a plurality of hole structures in a main surface of an n-doped silicon substrate, the hole structures each comprising an upper surface and defining a volume;
   forming a conductive zone in the upper surfaces of the hole structures and the main surface by doping the upper surfaces with an electrically active dopant;
   forming a dielectric layer on the conductive zone;
   forming a conductive layer on the dielectric layer, the dielectric and conductive layers filling only a portion of the volume each hole structure;
   forming an auxiliary layer on the conductive layer under a compressive mechanical stress, the auxiliary layer being coextensive with the conductive layer, the combination of the dielectric, conductive and auxiliary layers filling the volumes of the hole structures; and
   removing a portion of the auxiliary layer in registry with the main surface and not in registry with the hole structures.

10. The method of claim 9 wherein the electrochemical etching is performed with an acidic electrolyte comprising fluoride in contact with the main surface and wherein a voltage is applied between said electrolyte and the silicon substrate so that the silicon substrate is connected as an anode, and wherein a back side of the silicon substrate that is opposite the main surface is illuminated during the electrochemical etching.

11. The method of claim 10 wherein the hole structures have diameters ranging from about 0.5 μm to about 10 μm and depths ranging from about 50 μm to about 500 μm and wherein the hole structures comprise an aspect ratio ranging from about 30 to about 300.

12. The method of claim 11 wherein the step of forming the dielectric layer comprises forming multiple dielectric layers with a layer sequence of $SiO_2$, $Si_3N_4$ and $SiO_2$.

13. The method of claim 12 wherein the dopant is selected from the group consisting of phosphorous and boron and the dopant has a concentration ranging from $10^{20}$ cm$^{-3}$ and $10^{21}$ cm$^{-3}$ and wherein the dielectric layer has a thickness ranging from about 10 nm to about 100 nm and wherein the conductive layer comprises doped polysilicon and wherein the auxiliary layer has a thickness ranging from about 30 nm to about 250 nm and the step of forming the auxiliary layer comprises thermally oxidizing $SiO_2$.

14. The method of claim 12 wherein the dopant is selected from the group consisting of phosphorous and boron and the dopant has a concentration ranging from $10^{20}$ cm$^{-3}$ and $10^{21}$ cm$^{-3}$ and wherein the dielectric layer has a thickness ranging from about 10 nm to about 100 nm and wherein the conductive layer comprises doped polysilicon and wherein the auxiliary layer has a thickness ranging from about 50 nm to about 200 nm.

15. A method for producing at least one silicon capacitor comprising the following steps:

electrochemically etching a plurality of hole structures in a main surface of an n-doped silicon substrate, the hole structures each comprising an upper surface and defining a volume, the electrochemical etching being performed with an acidic electrolyte comprising fluoride in contact with the main surface and wherein a voltage is applied between said electrolyte and the silicon substrate so that the silicon substrate is connected as an anode, and wherein a back side of the silicon substrate that is opposite the main surface is illuminated during the electrochemical etching;

forming a conductive zone in the upper surfaces of the hole structures and the main surface by doping the upper surfaces with an electrically active dopant the dopant selected from the group consisting of phosphorous and boron and the dopant has a concentration ranging from $10^{20}$ cm$^{-3}$ and $10^{21}$ cm$^{-3}$;

forming a dielectric layer on the conductive zone;

forming a doped polysilicon conductive layer on the dielectric layer, the dielectric and conductive layers filling only a portion of the volume each hole structure;

forming an auxiliary layer on the conductive layer under a compressive mechanical stress, the auxiliary layer being coextensive with the conductive layer, the combination of the dielectric, conductive and auxiliary layers filling the volumes of the hole structures; and removing a portion of the auxiliary layer in registry with the main surface and not in registry with the hole structures.

16. The method of claim 15 wherein the hole structures have diameters ranging from about 0.5 μm to about 10 μm and depths ranging from about 50 μm to about 500 μm and wherein the hole structures comprise an aspect ratio ranging from about 30 to about 300.

17. The method of claim 15 wherein the dielectric layer has a thickness ranging from about 10 nm to about 100 nm and wherein the auxiliary layer has a thickness ranging from about 30 nm to about 250 nm.

18. The method of claim 15 wherein the step of forming the dielectric layer comprises forming multiple dielectric layers with a layer sequence of $SiO_2$, $Si_3N_4$ and $SiO_2$.

19. The method of claim 15 wherein the step of forming the auxiliary layer further comprises thermally oxidizing $SiO_2$.

20. A method for producing at least one silicon capacitor comprising the following steps:

electrochemically etching a plurality of hole structures in a main surface of an n-doped silicon substrate, the hole structures each comprising an upper surface and defining a volume, the electrochemical etching being performed with an acidic electrolyte comprising fluoride in contact with the main surface and wherein a voltage is applied between said electrolyte and the silicon substrate so that the silicon substrate is connected as an anode, and wherein a back side of the silicon substrate that is opposite the main surface is illuminated during the electrochemical etching, the hole structures having diameters ranging from about 0.5 μm to about 10 μm and depths ranging from about 50 μm to about 500 μm and wherein the hole structures comprise an aspect ratio ranging from about 30 to about 300;

forming a conductive zone in the upper surfaces of the hole structures and the main surface by doping the upper surfaces with an electrically active dopant the dopant selected from the group consisting of phosphorous and boron and the dopant has a concentration ranging from $10^{20}$ cm$^{-3}$ and $10^{21}$ cm$^{-3}$;

forming a dielectric layer on the conductive zone, the dielectric layer having a thickness ranging from about 10 nm to about 100 nm;

forming a doped polysilicon conductive layer on the dielectric layer, the dielectric and conductive layers filling only a portion of the volume each hole structure;

forming an auxiliary layer on the conductive layer under a compressive mechanical stress, the auxiliary layer being coextensive with the conductive layer, the combination of the dielectric, conductive and auxiliary layers filling the volumes of the hole structures, the auxiliary layer having a thickness ranging from about 30 nm to about 250 nm; and removing a portion of the auxiliary layer in registry with the main surface and not in registry with the hole structures.

21. The method of claim 20 wherein the step of forming the dielectric layer comprises forming multiple dielectric layers with a layer sequence of $SiO_2$, $Si_3N_4$ and $SiO_2$.

22. The method of claim 20 wherein the step of forming the auxiliary layer further comprises thermally oxidizing $SiO_2$.

* * * * *